United States Patent [19]

Milberger et al.

[11] Patent Number: 5,122,730

[45] Date of Patent: Jun. 16, 1992

[54] VOLTAGE DIVIDER FOR A WIDE BAND DOMINO EFFECT HIGH VOLTAGE REGULATOR

[75] Inventors: Walter E. Milberger, Panama City, Fla.; Charles S. Kerfoot, Pasadena; Franklin B. Jones, Catonsville, both of Md.

[73] Assignee: The United States of America as represented by the Secretary of the Air Force, Washington, D.C.

[21] Appl. No.: 730,139

[22] Filed: Jul. 15, 1991

Related U.S. Application Data

[62] Division of Ser. No. 459,870, Jan. 2, 1990, Pat. No. 5,070,538.

[51] Int. Cl.$^5$ ............................................. G05F 1/63
[52] U.S. Cl. .................................... 323/370; 323/280; 361/424
[58] Field of Search ............... 323/280, 281, 297, 298, 323/352, 353, 354, 364, 369, 370; 361/424

[56] References Cited

U.S. PATENT DOCUMENTS

| | | | |
|---|---|---|---|
| 4,034,283 | 7/1977 | Pellegrino | 323/370 |
| 4,274,003 | 6/1981 | Kuehnel et al. | 323/370 |
| 4,400,660 | 8/1983 | Schaefer | 323/280 |
| 4,489,141 | 12/1984 | Stafford et al. | 323/280 |
| 4,489,270 | 12/1984 | Diller | 323/354 |
| 4,706,012 | 11/1987 | Kerkman et al. | 323/280 |
| 4,908,566 | 3/1990 | Tesch | 323/280 |

Primary Examiner—Peter S. Wong
Attorney, Agent, or Firm—Bernard E. Franz; Donald J. Singer

[57] ABSTRACT

The high voltage regulator employs a field effect transistor (FET) amplifier and a shielded wide band frequency compensated RC voltage divider. The device comprises a FET amplifier used as a current source in a 20 KV power supply. The negative output of the supply is sensed by the voltage divider consisting of two resistors in parallel with two capacitors for frequency compensation. The voltage divider output is applied to the non-inverting input of an operational amplifier whose reference is set to affect the linear operation of an inverting operational amplifier. In the voltage divider, a variable high voltage quartz glass piston capacitor is used to set the RC product of the high level arm equal to that of the low level arm.

3 Claims, 4 Drawing Sheets

HIGH VOLTAGE DIVIDER CUT-AWAY VIEW

RESPONSE OF VOLTAGE DIVIDER FOR ONE AND TWO STAGE OP.

HIGH VOLTAGE DIVIDER CUT-AWAY VIEW

VOLTAGE DIVIDER FOR A WIDE BAND DOMINO EFFECT HIGH VOLTAGE REGULATOR

RIGHTS OF THE GOVERNMENT

The invention described herein may be manufactured and used by or for the Government of the United States for all governmental purposes without the payment of any royalty.

This is a division of application Ser. No. 07/459,870 filed Jan. 2, 1990, now U.S. Pat. No. 5,070,538.

RELATED PATENT APPLICATIONS

There are two related copending patent applications by the same applicants, "Domino Effect Amplifier" Ser. No. 7/318,211, now U.S. Pat. No. 4,897,617, issued Jan. 9, 1990, and "Domino Effect Shunt Voltage Regulator" Ser. No. 7/318,210, now U.S. Pat. No. 4,893,070, issued Jan. 30, 1990, both filed Feb. 28, 1989, which are hereby incorporated by reference. The parent application Ser. No. 07/459,870 is also incorporated by reference for matter cancelled from this divisional application.

BACKGROUND OF THE INVENTION

The present invention relates generally to a voltage divider for a wide band high voltage regulator, as disclosed in the parent application.

Until the invention of the Milberger Domino Effect Amplifier, all high voltage (2–100 kv) linear regulators used vacuum tubes as pass elements. Because of the auxiliary supplies needed to support the operation of vacuum tubes (filament and grid bias supplies), their use was most suitable for ground deck regulators. The most common regulator configuration used in transmitter supplies is one in which the vacuum tube is used in the ground return leg of the raw high voltage power supply. When a vacuum tube is used in this regulator configuration, the use of the novel compensated R-C high voltage divider disclosed herein will greatly improve the performance.

United States patents of interest include U.S. Pat. No. 3,289,057, to Melanson which teaches an adjustable capacitor with a moving dielectric. U.S. Pat. No. 3,361,945 to Mittler et al shows a piston capacitor having a cylindrical electrode, a piston electrode and a dielectric therebetween. U.S. Pat. No. 4,757,251 to Fuchs shows a circuit for a high voltage regulator wherein several output amplifiers are connected in series. U.S. Pat. No. 4,667,144 to Jones teaches a MOSFET isolation amplifier in a regulator for permitting precise regulation through a reactive load.

SUMMARY OF THE INVENTION

An objective of the invention is to provide a voltage divider for a high voltage transistor linear regulator of superior characteristics.

The invention relates to a wide band frequency compensated RC voltage divider. The voltage divider is used with a FET amplifier used as a current source in a 20 KV power supply. The negative output of the supply is sensed by the voltage divider consisting of two resistors in parallel with two capacitors. The voltage divider output is applied to the non-inverting input of an operational amplifier whose reference is set to affect the linear operation of an inverting operational amplifier.

A feature of the invention is a shielded wide band high voltage divider consisting of two resistors that are frequency compensated by parallel capacitors; wherein, a variable high voltage quartz glass piston capacitor is used to set the RC product of the high level arm equal to that of the low level arm.

DETAILED DESCRIPTION

Introduction

This disclosure introduces a high voltage transistor linear regulator of superior characteristics. At a regulated voltage of −16 kilovolts and a current of 40 milliamperes, the open loop cross-over frequency is one MHz as referenced to a 500-hertz, 55-dB corner. The wide bandwidth is made possible by using the Milberger Domino Effect linear amplifier in the power chain and a novel compensated R-C voltage divider in the regulator's feedback chain.

When a vacuum tube is used in this regulator configuration, the use of the novel compensated R-C high voltage divider disclosed herein will greatly improve the performance.

Regulator Circuit Configuration

Operation

Figure 1:
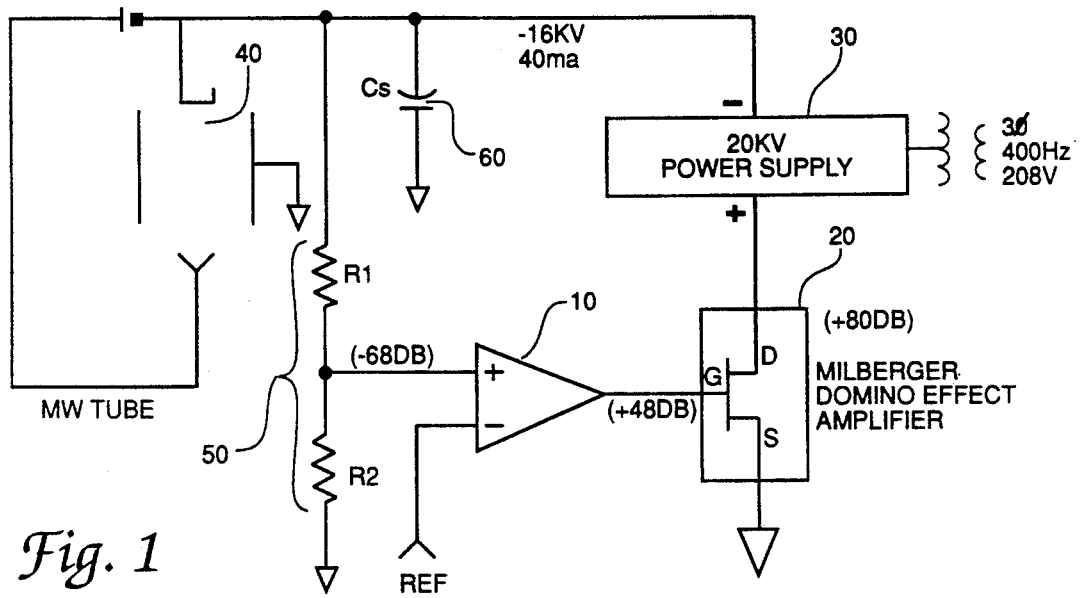
FIG. 1 is a block diagram of the Domino Effect Regulated Power Supply.

FIG. 1 is a block diagram of the Domino Effect Regulated Power Supply. In this configuration, a Domino Effect Amplifier 20 is used as a current source in the ground return of a 20-kilovolt raw power supply 30 power chain. The negative output of the supply 30 is sensed via a voltage divider 50 consisting of resistors R1 and R2. The voltage divider output is applied to the non-inverting input of an amplifier 10 whose reference is set to affect linear operation of the inverting amplifier 20.

Actual Regulator Characteristics

Figure 2:
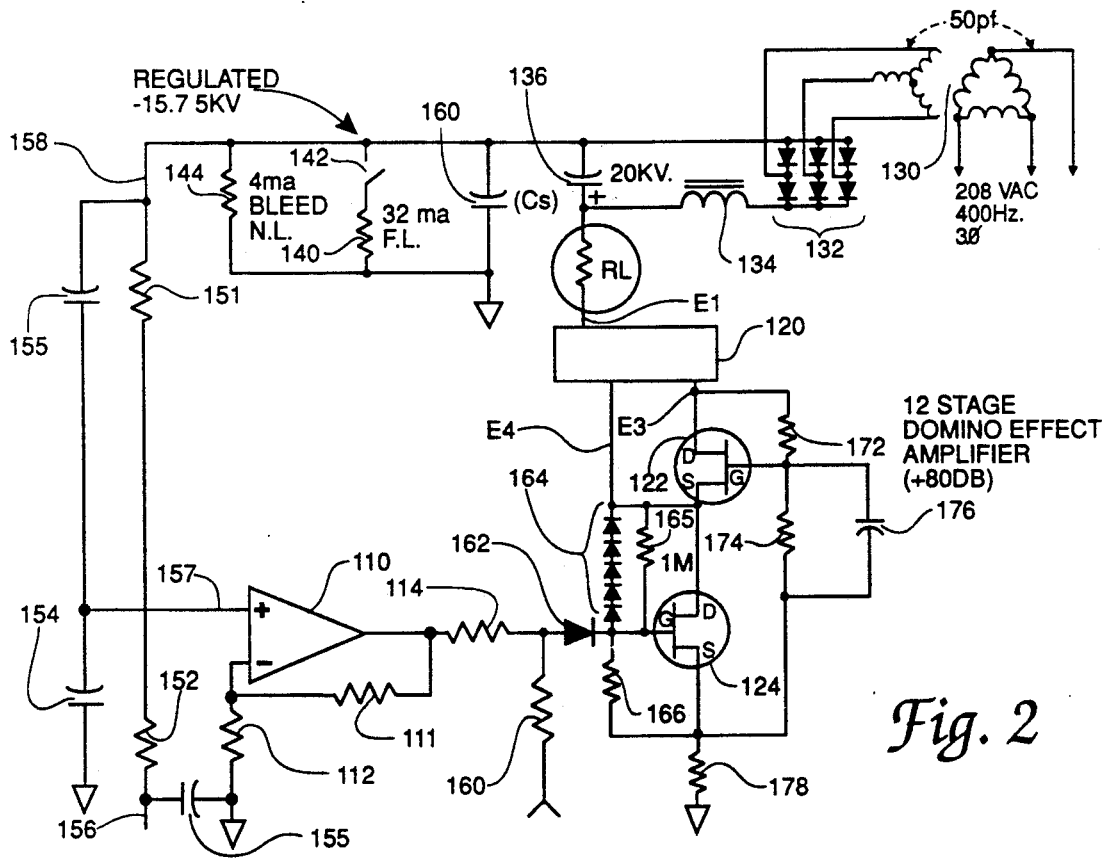
FIG. 2 is a schematic diagram of the Domino Effect Regulator.

The schematic diagram shown in FIG. 2 is the composite circuit used in the Wide Band Domino Effect H. V. Regulator. For the domino effect amplifier, a box 120 represents the 10-stage unit of FIG. 12, of the parent application and two additional stages use transistors 122 and 124. A one-megohm resistor 172 is connected from the drain to gate of transistor 122, and a one-megohm resistor 174 shunted by a 10-picofarad capacitor 176 is connected from the gate of transistor 122 to the source of transistor 124. A 5-kilohm resistor 166 is connected from the gate to source of transistor 124, and a 10-ohm resistor 178 is connected from its source to ground.

In place of the transmitter tube 40 of FIG. 1, FIG. 2 uses a full-load resistor 140 in series with a switch 142, and a no-load bleed resistor 144. For the voltage divider 50, FIG. 2 has a 250-megohm resistor 151 shunted by a 0–0.25 picofarad piston capacitor 153 in series with a 100-kilohm resistor 152, to provide a 2500:1 divider (−68 dB). A 0.047 microfarad capacitor 154 is connected from the divider junction at lead 157 to ground.

The lower end of resistor 152 is coupled to ground via a capacitor 155, across which a +6.3 volts DC reference voltage is applied at lead 156. The operational amplifier 110 has its plus input connected via lead 157 to the junction of resistors 151 and 152, its minus input connected via a 1000-ohm resistor 112 to ground, and a 200-ohm resistor connected from the output to the minus input. The output of the op amp 110 is coupled via a 100-ohm resistor 114 in series with a type 1N4148 blocking diode 162 to the gate of the first-stage transistor 124. Five type 1N4148 diodes 164 across a one-megohm resistor 165 are connected from the gate of transistor 124 to the source of transistor 122. The 20-kilovolt power supply comprises a delta-star three-phase transformer 130 which has 50 picofarads of capacitance between the primary and secondary, with the primary coupled to a 208-volt AC, 400 Hz, 3 phase source. The secondary of the transformer is connected to a rectifier unit of six diodes 132, and thence to a filter comprising a series 22-henry inductor and a 0.02 microfarad shunt capacitor.

Compensated R-C High Voltage Divider

Figure 3:
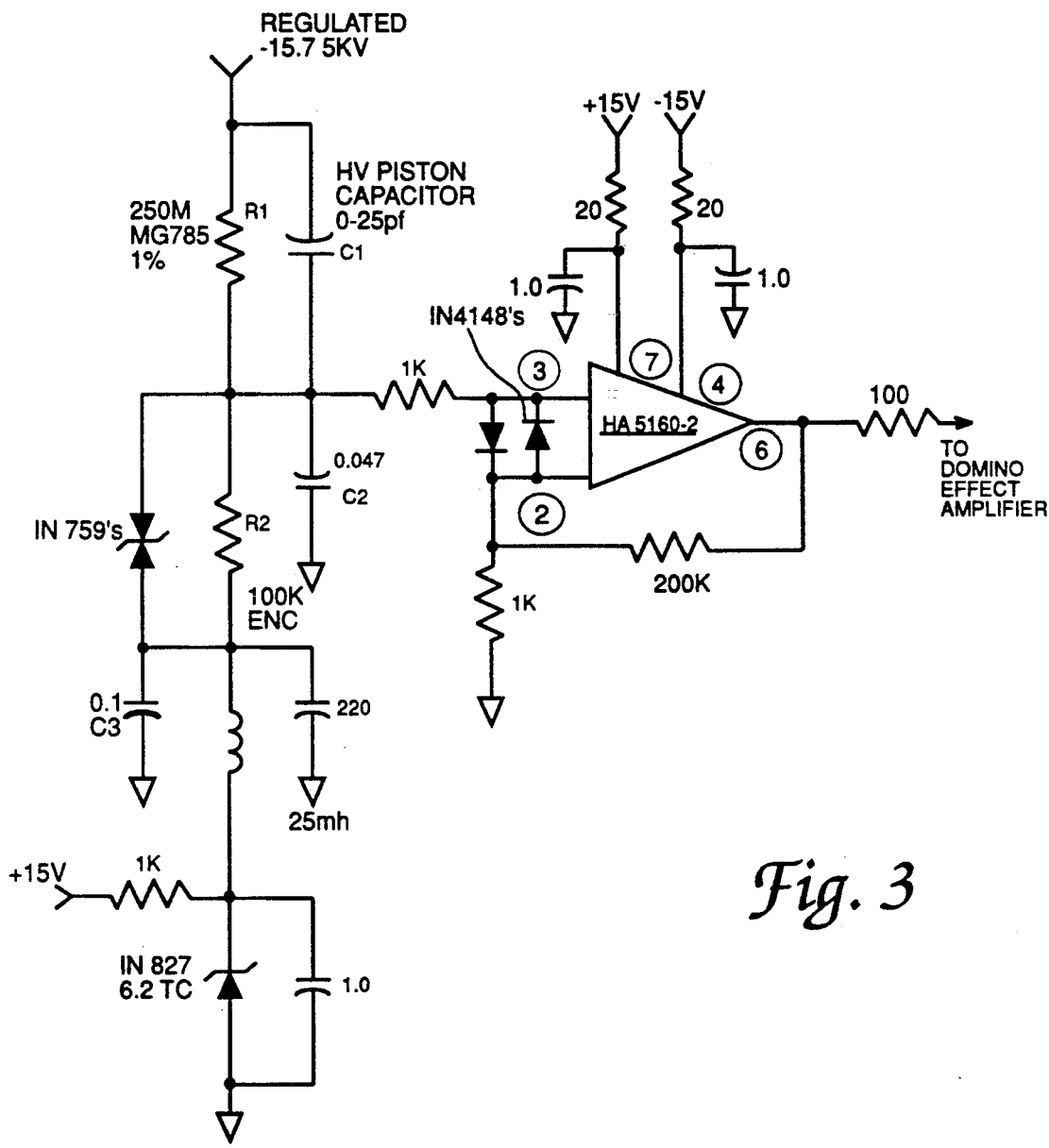
FIG. 3 is a divider and operational amplifier schematic diagram.

The 2500:1 R-C voltage divider and its isolation operational amplifier shown in FIG. 2 are detailed in FIG. 3. The compensated voltage divider is impervious to e.m.i. fields and/or its location is respect to ground.

Electrical Characteristics

Figure 4:
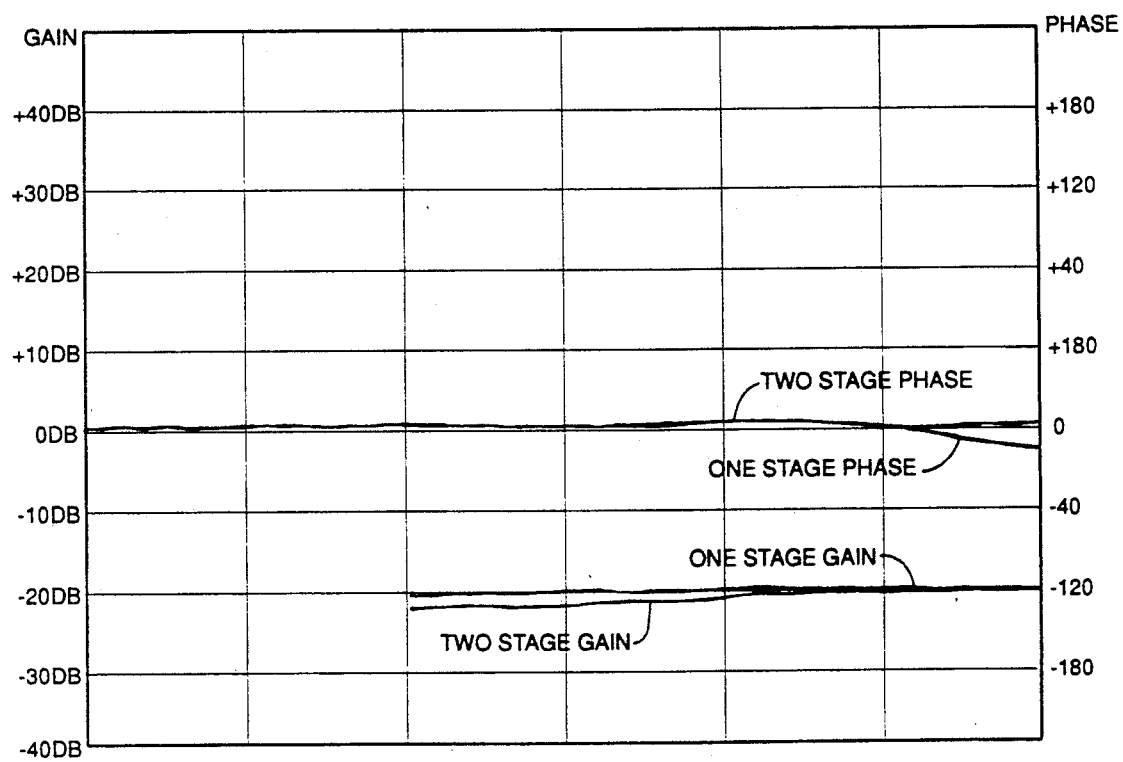
FIG. 4 is a graph showing the response of a voltage divider for one and two stage operational amplifiers.

Electrically the divider is of conventional design; wherein the r-c product of the high voltage leg is made equal to the low voltage leg. Zeners are placed across the bottom leg for protection against high voltage discharges. The back to back diodes across the input of the operational amplifier serve a similar function. Although an external reference of finer quality may be used, the development model used the 1N827 T.C. shown in FIG. 3. At 40 db of gain the Harris HA 5160-2 OpAmp is essentially flat out to 1 Mhz. Because of shielding requirements, the voltage divider and amplifier are considered to be a single unit. The gain-phase characteristics shown in FIG. 4 are the combined response of the voltage divider and amplifier. At 46 db the gain starts to fall off a bit before 1 MHz. For this reason, plots were made using a single 46 db gain stage and two cascade gain stages of equal gain. The regulator development model used a single amplifier, since the power train domino effect amplifier response sets the loop response.

Mechanical Packaging

Previous Methods

Many high voltage dividers of superb electrical characteristics have been designed. When applied to production systems, however, they often became faulty and not reproducible. Most of these shortcomings results from environmental changes and mechanical mounting. Environmental changes involve dust, temperature, E.M.I. radiation, etc. Mechanical tolerances for many dividers become critical because the distributed capacitance to ground affects the calibration. The placement of each part must be exactly the same as previous units in order to have repeatability. The placement of other components in the immediate vicinity likewise affects the calibration and also become critical. Even the routing and length of wiring to the divider was critical.

New Method

Figure 5:
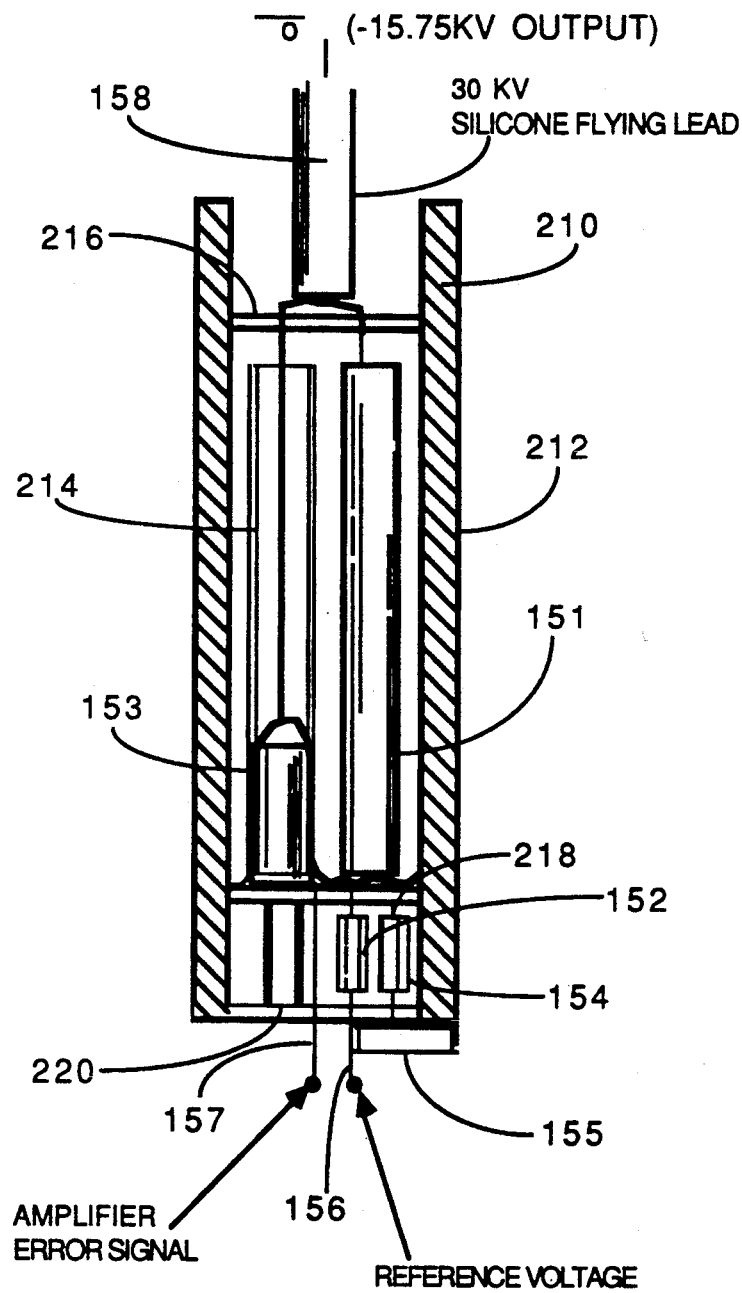
FIG. 5 is diagram with a cut-away view of a high voltage divider.

The high voltage divider developed for the Domino Effect Regulator uses several new principals. First, the divider is wholly contained inside a grounded, shielded enclosure. The outer shield, which is grounded makes the device impervious to mechanical location or the proximity of other components. Layouts can be completely reworked without affecting the calibration of the divider. FIG. 5 shows a cut-away view of the high voltage divider. The one inch epoxy tube 210 (with a 0.125 inch wall) used for the enclosure was selected on the basis of availability. Other suitable insulating materials can be used as long as adequate voltage breakdown is provided at the high voltage end. The outer surface was coated with copper to provide a copper shield 212 and electrical ground.

In a like-wise manner, the piston capacitor 153 (a high-voltage 0-25 picofarad capacitor C1), which is enclosed inside the shielded tube 210, is constructed by using a quartz glass tube 214 (a 0.125-inch quartz glass tube having a 25 mil wall), wherein, one plate of the capacitor is a cylindrical copper slug contained within the inner surface of the glass tube and the second plate is copper foil wrapper around the outer surface of the glass tube. The thickness of the quartz glass wall sets the distance between the two plates. Since high voltage stress and corona are important considerations, a quartz glass tube was used for the piston capacitor. Quartz glass has a dielectric strength of 20,000 volts per mil, so a tube that is thick enough to be mechanically sound is virtually impervious to the effects of high voltage and corona. It must be designed to be long enough to provide adequate creepage distance to span between the low voltage and high voltage connections.

The portion of the quartz tube near the low voltage end of the 250-Meg resistor 151 was wrapped with copper foil and attached to the low voltage end of the resistor. An appropriate extension of the bottom end of the quartz tube is made to allow for creepage between the inner portion slug and the bottom supporting disk. The piston slug is the other electrode of the capacitor while the quartz glass acts as the dielectric material. The piston slug was made with rounded ends to minimize corona. A small inner conductor was used to minimize capacitance in the rest of the tube and attaches the piston slug to the high voltage end of the 250 meg resistor 151. The capacitance value is adjusted by positioning the piston slug either more or less inside of the outer shield such that the overlap increases or decreases the surface area of the two concentrical capacitor plates that are separated by the quartz glass dielectric.

All divider components are affixed to supporting disk separators 216 and 218. The 250 Meg resistor 151 is positioned near the center to minimize its stray capacitance to ground. The quartz glass piston capacitor 153 parallels the 250 Meg resistor. The low voltage R-C components fit between two supporting disks 218 and 220 at the bottom of the epoxy tube 210. These components include the lower divider resistor 152, the capacitor 154, and the capacitor 155. The amplifier error signal lead 157 for the op amp 110 is connected to the junction of the divider resistors 151 and 152. The reference voltage input lead 156 is connected to the junction of resistor 152 and capacitor 155.

The entire assembly slips into the inner walls of the epoxy tube. The top disk is inserted far enough to provide the required creepage distance for the operational voltage. Silicone insulated wire 158 (a 30 kilovolt silicone flying lead) is used to exit the high voltage of the top disk 216.

In the development regulator, the entire divider assembly was soldered to a OpAmp shielded box. In a production system the operational amplifier and all of its associated components would be included in the divider tube. The breadboard regulator used FC-77 as a cooling and insulation media in which the voltage divider was immersed. The divider could be operated in SF-6 equally as well. For operating in air, the divider would be potted to maintain the same dimensions. The divider has excellent electrical characteristics and good mechanical integrity. It is highly reproducible and a low cost item. It solves the high voltage electrical problem while providing a high performance divider that is virtually impervious to external influences.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A shielded wide band high voltage divider comprising a high level arm in series with a low level arm, wherein the high level arm comprises a high-voltage resistor in parallel with a high-voltage capacitor coupled between a first terminal and a tap, and the low level arm comprises a low-voltage resistor in parallel with a low-voltage capacitor coupled between the tap and ground, so that the resistors are frequency compensated by the parallel capacitors; the high-voltage resistor having a high voltage end for connection via the first terminal to a high voltage direct current source and a low voltage end connected to said tap, wherein the high voltage capacitor is a variable high voltage piston capacitor used to set the resistance-capacitance product of the high level arm equal to that of the low level arm.

2. A shielded wide band high voltage divider according to claim 1, which is wholly contained inside an enclosure comprising an insulating tube coated with metal to provide a metal shield and electrical ground;

wherein the high-voltage capacitor comprises a quartz glass tube, a first plate which is a cylindrical metal slug contained within the inner surface of the quartz glass tube and a second plate which is a metal foil wrapper around the outer surface of the quartz glass tube, with the thickness of the quartz glass tube setting the distance between the two plates, the quartz glass tube being designed to be long enough to provide adequate creepage distance to span between low voltage and high voltage connections; the quartz glass tube having a portion near the low voltage end of said high-voltage resistor which is wrapped with said metal foil and attached to the low voltage end of the high-voltage resistor.

3. A shielded wide band high voltage divider according to claim 2, wherein said metal shield, metal slug and metal foil are copper;

wherein the high-voltage resistor and the high-voltage capacitor are supported within said enclosure between a first supporting disk at the high-voltage end and a second supporting disk at the low-voltage end, and the low-voltage resistor and the low-voltage capacitor are supported within said enclosure between the second supporting disk and a third supporting disk at an end of the enclosure;

wherein said quartz glass tube has an extension at the low voltage end made to allow for creepage between the inner portion slug and the second supporting disk, the metal slug has rounded ends to minimize corona, a small inner conductor is used to minimize capacitance in the rest of the quartz glass tube and attaches the metal slug to the high-voltage end of the high-voltage resistor, the capacitance value being adjusted by positioning the metal slug either more or less inside of the outer shield such that the overlap increases or decreases the surface area of the two concentrical capacitor plates that are separated dielectric formed by the quartz glass tube;

wherein the high-voltage resistor is positioned near the center of the enclosure to minimize its stray capacitance to ground, and the piston capacitor parallels the high-voltage resistor;

wherein the first supporting disk is inserted far enough into the enclosure to provide a required creepage distance for the operational voltage, and wherein the first terminal is formed with silicone insulated wire to exit at the first supporting disk.

* * * * *